May 5, 1959 S. K. TALLY ET AL 2,885,525

ENCAPSULATED ELECTRICAL RESISTORS AND PROCESS
FOR MANUFACTURING SAME
Filed April 10, 1956

Sidney K. Tally
Bernard J. Haidler
*INVENTOR.*

2,885,525

ENCAPSULATED ELECTRICAL RESISTORS AND PROCESS FOR MANUFACTURING SAME

Sidney K. Tally, Nashua, and Bernard J. Haidler, Manchester, N.H., assignors, by mesne assignments, to Sanders Associates, Inc., Nashua, N.H., a corporation of Delaware Application April 10, 1956, Serial No. 577,216

11 Claims. (Cl. 201—73)

The present invention is directed to electrical resistors and, particularly, to encapsulated resistors suitable for use with printed circuits. The invention is also directed to the process for manufacturing these resistors.

A tape resistor useful with printed-circuit baseboards and modules has been described in copending application, Serial No. 577,352, filed April 10, 1956, entitled "Electrical Resistors and Process for Manufacturing Same." In general, these tape resistors comprise a body including laminations of material coated with a resistive substance such as carbon with conductive leads affixed to the body between layers of the material.

Tape resistors of this type are suitable for a wide range of purposes but are not completely immune to effects due to high humidities. High humidities tend to cause water vapor to be deposited in the interstices of the tape material and to appear on the interfaces between the layers. This water vapor results in uncontrollable changes in resistance making the resistors impractical for general usage under such humidity conditions. In addition to this deficiency, the unencapsulated tape resistor such as described in the copending application has the conductive leads affixed thereto primarily by the adhesive effects of the resin in the silicone varnish used to coat and impregnate the tape. This adhesion tends to break with flexing of the conductive leads. In normal usage where the resistors are placed between accurately positioned terminals on a printed circuit baseboard or a ceramic wafer of a module, this characteristic is not bothersome since little if any bending of the leads is required. However, if a tape resistor is to have universal usage there is need for more positive securing of the leads to the resistor.

As described in the copending application, a plastic such as tri-fluoro-chloro-ethylene known as Kel-F and manufactured by the M. W. Kellogg Company has been used for encapsulation purposes. However, this simple approach does not provide an adequate seal, particularly at the interfaces of the sheets of Kel-F material through which the conductive leads pass. Moisture tends to leak into the interior through openings between the interfaces and flexing of the conductive leads tends to aggravate this leakage. In addition, the Kel-F bonding is not sufficiently rigid mechanically to secure the leads to the resistor.

It is therefore an object of the present invention to provide an encapsulated electrical resistor which does not have the deficiencies of prior such resistors.

It is also an object of the present invention to provide an encapsulated resistor having negligible moisture leakage and providing rigid support for the conductive leads.

It is still a further object of the present invention to provide a method for encapsulating a resistor to provide these benefits.

In accordance with the present invention, an encapsulated electrical resistor comprises a body of resistive material having a pair of conductive leads extending therefrom. The resistor also comprises a flexible plastic encapsulation for sealing the resistive body and providing a seal at the junction of the leads and the resistive body. Supporting members are integrally formed with the encapsulation disposed transverse to the leads and spaced from the junction seal in contact with the leads. This provides stiffening between the members and the junction and provides a bending axis for the leads to preclude flexure of the leads adjacent the junction and consequent impairment of the seal at the junction.

The present invention also provides a process for encapsulating an electrical resistor which comprises providing a strip of resistive material subject to variation in resistance with changes in humidity and placing a multiplicity of conductive leads on the surface of the strip, perpendicular to the strip, and along both longitudinal edges of the strip. The conductive leads are fixed to and maintained in parallel spaced relation by a pair of conductive elements perpendicular to the conductive leads, thus forming a ladder-like structure. The strip is then encapsulated within a plastic insulating material to provide a seal at the junction of the leads and the resistive strip. The insulating material is then covered with a fibrous material having in the vicinity of the junction seal fibres of larger diameter than the other fibres. These larger fibres run transverse to the leads and are spaced from the junction seal. The conductive leads are laminated between the larger fibres to provide stiffening between the larger fibres and the junction seal and to provide a bending axis for the leads. This precludes flexure of the leads adjacent the junction and consequent impairment of the seal at the junction. The strip is then cut in parallel with and between the conductive leads to disconnect adjacent leads and provide a plurality of resistors.

For a better understanding of the present invention, together with other and further objects thereof, reference is made to the following description taken in connection with the accompanying drawing and its scope will be pointed out in the appended claims.

*Description of encapsulated electrical resistor*

Figure 1:
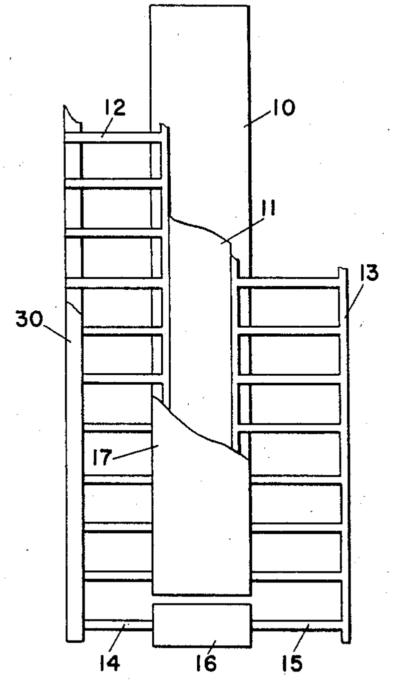
Fig. 1 represents, in partially cut-away plan view, an electrical resistor made in accordance with the process described in copending application, Serial No. 577,352.

Referring now to Fig. 1, the resistor assembly there represented comprises a first layer 10 of fibrous material such as #996 Dow-Corning Silicone Impregnated Quinterra Asbestos as manufactured by Johns-Manville. The strip 10 is approximately ⅜" wide and may be as long as can easily be handled. Ordinarily, the length is 6 or 8 inches. This material is coated with a resistive substance such as channel and furnace carbon mixed with silicone resin varnish. An intermediate layer of narrower material 11 similar to the material 10, except for the lack of impregnation by resistive material, may also be provided as explained more fully in the copending application. The strip 11 may be, for example, approximately 5/16" wide. The intermediate layer also includes a pair of ladder-like members 12 and 13 having rungs which provide conductive leads for individual resistors such as leads 14 and 15 for the resistors 16 at the bottom of Fig. 1 and more fully represented after encapsulation by Fig. 3. The members 12 and 13 may be stampings obtained from, for example, copper sheet material having a thickness of approximately .004″. To eliminate the harmful effects of copper oxidation the members 12 and 13 are normally plated, for example, by nickel or silver. Finally, a top layer of material 17 identical with the bottom layer 10 is provided.

As more fully described in the copending application, the assembly of the fibrous materials 10, 11 and 17 with the ladder-like members 12 and 13 is placed in a press and cured in an oven to provide a unit in which the laminations permanently adhere to each other. The outer rail of one of the ladder-like members, for example, the outer rail of the member 12, is then removed and the tapes divided into segments to provide individual resistors in the manner represented for the resistors 18 and 19 of Fig. 2. To maintain the individual resistors in place an adhesive material 30, such as gummed tape or any pressure adhesive substance, is affixed to both sides of the outer edge of the member 12 to replace the rail that had been removed.

Figure 2:
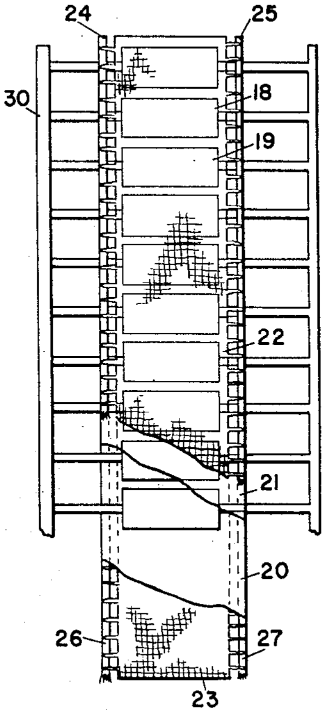
Fig. 2 represents, in partially cut-away plan view, an electrical resistor prepared in the manner represented in Fig. 1 encapsulated in accordance with the present invention.
Figure 4:
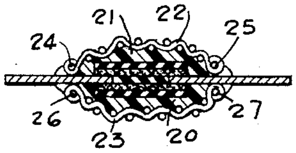
Fig. 4 represents a cross sectional view of the resistor of Fig. 3 taken along the lines 4—4.

As thus far described, the resistors are identical with those described in the copending application. To encapsulate these resistors in accordance with the present invention, strips of plastic material such as the aforementioned Kel-F are positioned on both sides of the resistor elements. Fig. 2 indicates a strip 20 below the resistor elements, while Fig. 4 more fully indicates the two strips 20 and 21. The strips 20 and 21 are enclosed by a pair of tapes 22 and 23, seen in cross section in Fig. 4, note that the tapes 22 and 23 have beaded edges 24, 25, 26 and 27.

The tapes 22 and 23 are preferably of Fiberglas approximately 7/16″ wide and 2 mils thick. The Fiberglas tape is first impregnated with an epoxy resin and partially heat cured, for example, at approximately 100° C. for 15 minutes. The tape is then properly positioned with respect to the Kel-F strips and resistors in a mold. The mold is placed in a heated hydraulic press and the platens of the press are placed in contact with the mold without applying pressure. The temperature of the mold is then raised to approximately 230° C. and maintained there for approximately 6 minutes. At this time a pressure of about 400 p.s.i. is applied for 5 minutes, during which time the temperature is raised to approximately 264° C. The mold is then immediately removed from the press and quenched in water maintained at room temperature. The resistor assembly is removed from the mold and appears as represented in Fig. 2. The individual resistors are then separated from each other by removing the adhesive material 30 and the outer rail of the sheet member 13.

Figure 3:
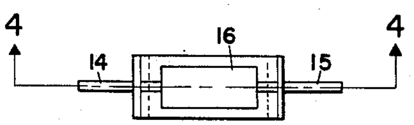
Fig. 3 represents in plan view a single encapsulated resistor from the group of Fig. 2.

This process is such that each of the resistors, such as the resistors 16, 18 and 19, of Figs. 2 and 3 are individually encapsulated in Kel-F which is reinforced with an impregnated Fiberglas outer covering having reinforcing beaded edges. The Fiberglas becomes a substantially rigid jacket for the Kel-F encapsulation and the beaded edges of the Fiberglas provide rigid mechanical support for the conductive leads of the resistor. Consequently, the encapsulation process not only provides an hermetically sealed resistor but additionally one in which additional and needed support is provided for the conductive leads of the resistor.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An encapsulated, electrical resistor, comprising: a body of resistive material having a pair of conductive leads extending therefrom; a flexible plastic encapsulation for sealing said resistive body and providing a seal at the junction of said leads and said resistive body; supporting members integrally formed with said encapsulation disposed transverse to said leads and spaced from said junction seal in contact with said leads to provide stiffening between said members and said junction and to provide a bending axis for said leads to preclude flexure of said leads adjacent said junction and consequent impairment of said seal at said junction.

2. An encapsulated electrical resistor, comprising: a body of resistive material having a pair of conductive leads extending therefrom; a flexible encapsulation for sealing said resistive body and providing a seal at the junction of said leads and said resistive body, said encapsulation having an inner layer of plastic and an outer covering of fibrous material having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction.

3. An encapsulated electrical resistor, comprising: a body of resistive material including layers of fibrous material impregnated with carbon and having a pair of conductive leads extending therefrom; a flexible encapsulation for sealing said resistive body and providing a seal at the junction of said leads and said resistive body, said encapsulation having an inner layer of plastic and an outer covering of fibrous material having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction.

4. An encapsulated electrical resistor, comprising: a body of resistive material, subject to variation in resistance with changes in humidity, having a pair of conductive leads extending therefrom; a flexible encapsulation for sealing said resistive body and providing a seal at the junction of said leads and said resistive body, said encapsulation having an inner layer of plastic and an outer covering of fibrous material, impregnated with a resin, having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction.

5. An encapsulated electrical resistor, comprising: a body of resistive material, subject to variation in resistance with changes in humidity, including layers of fibrous material impregnated with carbon and having a pair of thin, flat, conductive leads extending therefrom; a flexible encapsulation for sealing said resistive body and providing a seal at the junction of said leads and said resistive body, said encapsulation having an inner layer of plastic and an outer covering of fibrous material having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction.

6. The process of encapsulating an electrical resistor, which comprises: providing a strip of resistive material subject to variation in resistance with changes in humidity; placing a multiplicity of conductive leads on the surface of said strip perpendicular to said strip and along both longitudinal edges thereof, said conductive leads being fixed to and maintained in parallel spaced relation by a pair of conductive elements perpendicular to said conductive leads, thus forming a ladder-like structure; encapsulating said strip within a plastic insulating material to provide a seal at the junction of said leads and said resistive strip; covering said insulating material with fibrous material having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; and cutting said strip in parallel with and between said conductive leads to disconnect adjacent leads and provide a plurality of resistors.

7. The process of encapsulating an electrical resistor, which comprises: providing a strip of resistive material subject to variation in resistance with changes in humidity; placing a multiplicity of conductive leads on the surface of said strip perpendicular to said strip along one longitudinal edge thereof, said conductive leads being fixed to and maintained in parallel spaced relation by means of a pair of parallel conductive elements perpendicular to said conductive leads, thus forming a ladder-like structure; placing a multiplicity of conductive leads, fixed in parallel spaced relation by means of parallel conductive elements, on the surface of said strip perpendicular to said strip along the other longitudinal edge thereof with said opposed conductive leads transversely aligned in one-to-one correspondence; encapsulating said strip within a thermosetting plastic insulating material to provide a seal at the junction of said leads and said resistive strip; covering said insulating material with woven Fiberglas having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; and cutting said strips in parallel with and between said conductive leads to disconnect adjacent leads and provide a plurality of resistors.

8. The process of encapsulating an electrical resistor, which comprises: providing a strip of resistive material subject to variation in resistance with changes in humidity; placing a multiplicity of conductive leads on the surface of said strip perpendicular to said strip along one longitudinal edge thereof, said conductive leads being fixed to and maintained in parallel spaced relation by a pair of parallel conductive elements perpendicular to said conductive leads, thus forming a ladder-like structure; placing a multiplicity of conductive leads, fixed in parallel spaced relation by means of parallel conductive elements, on the surface of said strip perpendicular to said strip along the other longitudinal edge thereof with said opposed conductive leads transversely aligned in one-to-one correspondence; encapsulating said strip within polytrifluorochloroethylene to provide a seal at the junction of said leads and said resistive strip; covering said polytrifluorochloroethylene with fibrous material having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; and cutting said strip in parallel with and between said conductive leads to disconnect adjacent leads and provide a plurality of resistors.

9. The process of encapsulating an electrical resistor, which comprises: providing a strip of resistive material subject to variation in resistance with changes in humidity; placing a multiplicity of conductive leads on the surface of said strip perpendicular to said strip along one longitudinal edge thereof, said conductive leads being fixed to and maintained in parallel spaced relation by a pair of parallel conductive elements perpendicular to said conductive leads, thus forming a ladder-like structure; placing a multiplicity of conductive leads, fixed in parallel spaced relation by means of parallel conductive elements, on the surface of said strip perpendicular to said strip along the other longitudinal edge thereof with said opposed conductive leads transversely aligned in one-to-one correspondence; encapsulating said strip within a plastic insulating material to provide a seal at the junction of said leads and said resistive strip; covering said insulating material with fibrous material, impregnated with an epoxy resin, having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; and cutting said strip in parallel with and between said conductive leads to disconnect adjacent leads and provide a plurality of resistors.

10. The process of encapsulating an electrical resistor, which comprises: providing a strip of resistive material subject to variation in resistance with changes in humidity; placing a multiplicity of conductive leads on the surface of said strip perpendicular to said strip along one longitudinal edge thereof, said conductive leads being fixed to and maintained in parallel spaced relation by a pair of parallel conductive elements perpendicular to said conductive leads, thus forming a ladder-like structure; placing a multiplicity of conductive leads, fixed in parallel spaced relation by means of a pair of parallel conductive elements, on the surface of said strip, perpendicular to said strip along the other longitudinal edge thereof with said opposed conductive leads transversely aligned in one-to-one correspondence; encapsulating said strip within polytrifluorochloroethylene to provide a seal at the junction of said leads and said resistive strip; covering said polytrifluorochloroethylene with woven Fiberglas, impregnated with epoxy resin, having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; and cutting said strip in parallel with and between said conductive leads to disconnect adjacent leads and provide a plurality of resistors.

11. The process of encapsulating an electrical resistor, which comprises: providing a strip of resistive material subject to variation in resistance with changes in humidity; placing a multiplicity of thin, flat conductive leads on the surface of said strip perpendicular to said strip along one longitudinal edge thereof, said conductive leads being fixed to and maintained in parallel spaced relation by a pair of thin, flat, parallel conductive elements perpendicular to said conductive leads thus forming a ladder-like structure; placing a multiplicity of thin, flat, conductive leads, fixed in parallel spaced relation by means of a pair of thin, flat, parallel conductive elements, on the surface of said strip perpendicular to said strip along the other longitudinal edge thereof said opposed conductive leads transversely aligned in one-to-one correspondence; encapsulating said strip within polytrifluorochloroethylene to provide a seal at the junction of said leads and said resistive strip; covering said polytrifluorochloroethylene with woven Fiberglas, impregnated with an epoxy resin, having, transverse to said leads in the vicinity of said junction seal spaced from said junction seal, fibers of larger diameter than the other fibers, said conductive leads being laminated between said larger fibers to provide stiffening between said larger fibers and said junction seal and to provide a bending axis for said leads to preclude flexure of said leads adjacent said junction and consequent impairment of said seal at said junction; cutting said strip in parallel with and between said conductive leads to disconnect adjacent leads and provide a plurality of resistors; and heat curing said resistors while under pressure.

References Cited in the file of this patent

UNITED STATES PATENTS

| | | |
|---|---|---|
| 2,061,516 | Frese | Nov. 17, 1936 |
| 2,176,604 | Benkelman | Oct. 17, 1939 |
| 2,629,166 | Marsten et al. | Feb. 24, 1953 |
| 2,683,673 | Silversher | July 13, 1954 |
| 2,701,392 | Eich | Feb. 8, 1955 |
| 2,717,946 | Peck | Sept. 13, 1955 |
| 2,745,931 | Heibel | May 15, 1956 |
| 2,751,477 | Fitzgerald | June 19, 1956 |

OTHER REFERENCES

Javitz: "Cast-Resin Embedments of Circuit Subunits and Components," Electrical Manufacturing, 1951, pages 103–118. 18–59E.